PROCESS FOR SECURING A CONDUCTOR TO A SEMICONDUCTOR

Filed June 22, 1961

INVENTORS
WALTER BETTERIDGE
HAMISH C. ANGUS
BY
A. W. Deller
ATTORNEY

United States Patent Office 3,186,084
Patented June 1, 1965

3,186,084
PROCESS FOR SECURING A CONDUCTOR TO A SEMICONDUCTOR

Walter Betteridge, Park Langley, Beckenham, and Hamish Carmichael Angus, Pinner, England, assignors to The International Nickel Company, Inc., New York, N.Y., a corporation of Delaware Filed June 22, 1961, Ser. No. 118,914
Claims priority, application Great Britain, June 24, 1960, 22,225/60
4 Claims. (Cl. 29—472.9)

Figure 1:
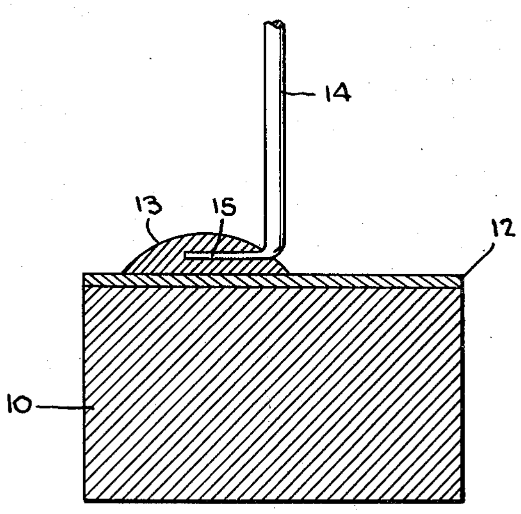

The present invention relates to semiconductor devices and more particularly to the process for making electrical contacts with semiconductor devices.

It is well known that electrical semiconductors are being used to an increasing extent in electric and/or electronic circuits, particularly in the form of devices known as transistors, thermistors, etc. One of the problems faced by the art in adapting semiconductors for commercial use is the problem of making suitable electric contact with the semiconductors.

The semiconductor materials most commonly used for transistors are germanium and silicon. In these cases, the problem of making electric contact therewith is not severe since electric leads of metal are usually attached to the surface of these materials by soldering or brazing. Although semiconductors are ordinarily sensitive to the effects of temperature, the temperatures to which germanium and silicon semiconductors are exposed in service are ordinarily quite low, generally not exceeding about 150° C., so that soldering and/or brazing materials can be used whose melting points are not approached in service but are still low enough so that the properties of the semiconductors are not impaired by contact with molten metal. In these particular semiconductors the diffusion of impurities is often very important and it is necessary to control the diffusion process very critically so that in any subsequent operation to join electrical contacts to the surface the distribution of impurities must not be altered. Germanium should not be heated above about 600° C. and silicon should not be heated above about 800° C.

A second class of semiconductor materials consists of compounds of the Group III–V elements, e.g., gallium arsenide and indium antimonide. The melting points of these compounds are fairly low and of course must not be closely approached during the life of the semiconductor. For instance gallium arsenide should not be heated above about 500° C. and indium antimonide should not be heated above about 400° C.

Semiconductor materials of a third class are composed essentially of oxides resembling refractories, exemplified by nickel oxide and ruthenium dioxide. These can be heated without harm nearly up to 1000° C.

Numerous other materials are also semiconductors and must not be heated close to their melting points. These include materials such as silicon carbide and bismuth telluride.

Now it is easy to make a joint with a solder or brazing alloy that melts at a low temperature, because even with the Group III–V compounds the temperature need never be dangerously high during the soldering or brazing operation. However the joint when made must remain satisfactory throughout the service life, and increasingly semiconductors are being used at elevated temperatures, which often exceed 400° C. and may approach 1000° C. Of course any given material is used only at a maximum temperature below that at which either its electrical properties would be impaired or the joint would fail. At such elevated temperatures, however, joints made with ordinary solders or brazing alloys fail. If a brazing alloy is to be used its melting point must be higher than the service temperature, and in making the joint with it the electrical properties are likely to be impaired.

For these reasons electrical contact with semiconductors operating at elevated temperatures has been made by pressing metal plates against their surfaces by springs, with the disadvantage that the springs may relax at the service temperature so that contact may be broken.

It has now been discovered that electrical contacts may be secured to semiconductors by a unique process to produce novel devices having useful physical, chemical and electrical characteristics even at high temperatures.

It is an object of the present invention to provide a novel process for securing metallic contact members to semiconductors and/or electronic elements.

Another object of the invention is to provide a novel electrical connection between a semiconductor and a metal conductor.

The invention also contemplates providing a novel semiconductor and/or semiconductor device that has useful electrical characteristics even at elevated temperatures.

Figure 2:
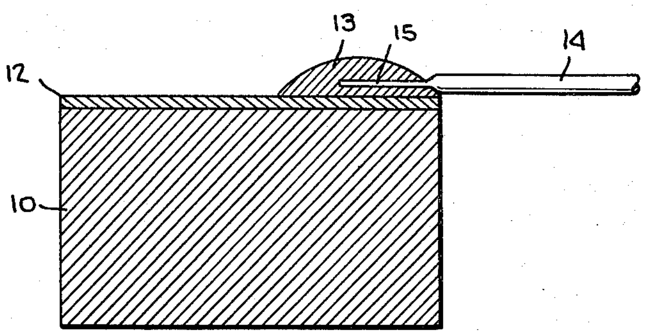

Other objects and advantages will become apparent from the following description taken in conjunction with the accompanying drawings in which:

FIGURE 1 is a cross-sectional view of a semiconductor device (partly exaggerated) according to the present invention in which a lead and/or conductor is attached thereto; and FIGURE 2 depicts another embodiment within the contemplation of the present invention.

Referring to the drawings, FIGURES 1 and 2 show a semiconductor 10 having an adherent metal coating 12 to which is added a thicker layer 13 into which is embedded a conductor element 14 having a flattened end 15.

Advantageously the metal layer may be composite, i.e., being formed of two or more coatings. The first coating 12 covers part of the semiconductor surface 10 and then the flattened end portion 15 of an electrical conductor 14 is put into contact with this coating and embedded by one or more further coatings. For example, the surface of the semiconductor may be coated to a thickness of about 0.00002 inch with precious metal, e.g., platinum. Thereafter, a precious metal wire, e.g., platinum, is pressed against the surface of the precious metal coating on the semiconductor and further thicker local coatings built up to give an adherent mass 13 capable of securely holding the conductor element 14.

Generally speaking the present invention contemplates a unique process for making novel electrical connections or joints between a semiconductor body and a platinum-group metal conductor. Advantageously, the electrical connection is made so that it is ohmic and not rectifying.

According to this invention we make an electrically conducting joint between a wire or other metallic conductor element and a metal layer firmly adherent to the electrical semiconductor material by assembling the two together, embedding the end of the electrical conductor element in a paste-like dispersion of a metal powder in a liquid vehicle consisting of or containing a thermally decomposable compound and heating the assembly to decompose the compound. The temperature used in making such a joint must be high enough to decompose the compound but not greatly exceed its decomposition temperature. This temperature may actually be lower than the service temperature, and in any case is below that at which the electrical properties are impaired.

Advantageously according to this invention, a metallic contact member or other conductor element is secured to the surface of a semiconductor by a particulate metal layer and/or coating formed on the surface of the semiconductor by heating a dispersion of a platinum-group metal powder in a liquid vehicle containing a thermally decomposable platinum-group metal compound which decomposes at a temperature that is at least 20 to 25% below the temperature at which the properties of the semiconductor are adversely affected. Preferably, the metallic contact member is secured to an initially formed coating by pressing the contact member against the metal coating and then providing a further coating by decomposition of said dispersion around the contact member on the semiconductor. However, the pressing step can be carried out simultaneously with the thermal decomposition treatment. The temperature used in making such a joint and/or electrical connection must be high enough to decompose the metal compound but need not exceed the decomposition temperature of the metal compound. This temperature may be considerably below the maximum service temperature of the semiconductor although the melting point of the metal of the joint exceeds and may be well above that maximum.

In the invention no metal is melted in order to form the joint, in contrast to processes in which joints are made by soldering or brazing. Therefore metals of high melting point can be used to form the joint, and we prefer to use precious metal (silver, gold and metals of the platinum group).

Preferably the decomposable compound is itself metal-bearing. In this case the powder and the metal of the decomposable compound may or may not be the same. The metal powder may, for example, be flake platinum and the liquid vehicle may be a thermally decomposable platinum compound. We find that the strongest joints are made when we use a thermally decomposable compound containing gold or silver as the vehicle for the metal powder.

A vehicle in the form of a resinous solution may be used. It must be wholly decomposable at the temperature of making the joint and not contaminate the joint. One such solution is alkaline condensed methanol methyl cyclohexane polymer in 2-ethoxy ethanol.

The firmly adherent metal layer through which the electrical connection between the metal conductor and the semiconductor material is made may be formed from the dispersion as a result of the thermal decomposition, but we find that to make a good bond with the surface of the semiconductor material it is usually necessary to form this layer in one or more initial steps. It may be most conveniently made by the thermal decomposition of a metal-bearing liquid that contains no metal powder in dispersion. It may be formed in a single stage or by successive applications and heating of the liquid.

In choosing a metal-bearing liquid for the production of the firmly adherent layer or as the liquid vehicle of the dispersion for a particular joint, regard must of course be paid to the nature of the semiconductor material. When the maximum permissible temperature is about 450° C. a suitable vehicle is the reaction product of chloroplatinic acid and di-iso-propyl ether concentrated in the presence of nitric acid (as described in U.S. Patent 3,083,-109, granted March 26, 1963, on U.S. application Serial No. 8,400, which is a division of copending U.S. application Serial No. 716,402, now abandoned) which contains at least about 600 grams per liter and up to about 1300 grams of platinum per liter and which decomposes at about 450° C. A vehicle which decomposes at 400° C. is a solution of gold tertiary-dodecyl-mercaptan in heptane containing 30% gold. These liquids can be used alone to form the firmly adherent layer. It is desirable to prevent oxidation during the decomposition, and for this reason an atmospheric containing a reducing gas such as hydrogen may be used. The rates of decomposition of these various liquids depend on the gaseous atmosphere in which the decomposition takes place. The rate of decomposition also depends on the temperature, and the temperatures quoted above are those at which decomposition can be affected at a practical rate, in an atmosphere consisting of 90% nitrogen and 10% hydrogen.

We find that slow heating is important in the production of a good bond between the metal and the semiconductor material, and is desirable in obtaining a good bond between the metal and the electrical conductor. The temperature of the heating may be raised in stages or progressively to bring it at a slow rate to the final decomposition temperature.

The proportion of the metal powder in the dispersion is not critical, and is determined entirely by the practical consideration that to embed the end of the metal conductor and have it remain in position in the assembly the dispersion must be of a stiff consistency and resemble a paste.

In making a joint the semiconductor material may first be coated with a thermally decomposable metal-bearing liquid by means of a brush and then heated in an atmosphere of 10% hydrogen and 90% nitrogen for 10 minutes at 100° C., 10 minutes at 300° C. and 30 minutes at 400 or 450° C. in accordance with the nature of the liquid. The thickness of the initial firmly adherent layer may be about 0.00002 inch, and to produce a layer of this thickness the coating and heating steps described may have to be performed twice. Next a thin layer of the paste-like dispersion may be spread over this layer and a conducting wire (say of platinum, palladium or silver), flattened at its end, may be pressed into the dispersion and then covered by more dispersion. The assembly may then be heated in the same atmosphere and for the same time as during the formation of the initial layer.

On proceeding in this way we have produced satisfactory joints with the following vehicles and with decomposition at the temperatures shown.

| Semi-conductor | Germanium | Silicon | Gallium arsenide | Ruthenium dioxide |
|---|---|---|---|---|
| Vehicle for providing a firmly adherent layer on the semiconductor surface | $V_1$ | $V_1$ | $V_1$ | $V_1$. |
| Paste-like dispersion in which electric conductor is embedded | $D_1$, $D_2$, $D_3$ | $D_3$ | $D_2$ | $D_2$. |

$V_1$=Reaction product of chloroplatinic acid and di-isopropyl ether concentrated in the presence of nitric acid in Serial No. 716,402, 450° C.
$D_1$=Platinum powder in a solution of a condensed methanol methyl cyclohexane polymer in 2-ethoxy ethanol, 450° C.
$D_2$=Platinum powder in a reaction product of chloroplatinic acid and di-isopropyl ether concentrated in the presence of nitric acid as described in Serial No. 716,402, 450° C.
$D_3$=Platinum powder in a solution of tertiary-dodecylmercaptan in heptane containing 30% gold.

For the purpose of giving those skilled in the art an even better understanding of the invention the following illustrative examples are given:

*Example 1*

Semi-conductor body ---------- Silicon parallelepiped 4 x 2 x 0.4 mm. weight 7 milligrams.
Conductor element ------------ Platinum wire 0.08 mm. diameter.

Foot of wire beaten out so as to form a flattened foot (end) portion about 0.04 mm. thick, about 0.1 mm. wide and about 2 mm. long, the plane of said foot portion being approximately perpendicular to the axis of the wire.

The vehicle used for applying a firmly adherent layer to the semi-conductor surface was: $V_1$ of the table above. This was painted on the surface and heated slowly to about 450° C. This layer was then covered with a thin film of a paste-like dispersion in accordance with $D_1$ of the table above and the beaten end of the wire held therein. The layer was covered with more of the paste-like dispersion $D_1$ and the whole assembly placed in a boat which was inserted in a furnace containing an atmosphere of forming gas (10% hydrogen, 90% nitrogen). The boat and its contents were slow heated, i.e., 10 minutes at 100° C., 10 minutes at 300° C., ½ hour at 450° C. The semi-conductor was removed and allowed to cool. The bond formed between the wire and the semi-conductor broke under a straight pull of 30 grms.

*Example 2*

| | |
|---|---|
| Semi-conductor body | Gallium arsenide parallelepiped 8 x 5 x 0.7 mm. weight 165 milligrams. |
| Conductor element | Platinum wire 0.025 mm. diameter. |

Foot of wire beaten out so as to form a flattened foot (end) portion about 0.1 mm. thick, about 0.6 mm. wide and about 5 mm. long, the plane of said foot portion being approximately perpendicular to the axis of the wire.

The vehicle used for applying a firmly adherent layer to the semi-conductor surface was: $V_1$ of the table above. This was painted on the surface and heated slowly to about 450° C. This layer was then covered with a thin film of a paste-like dispersion in accordance with $D_3$ of the table above but containing platinum flake to give a dispersion of the desired consistency. The beaten end of the wire was then held in contact with this layer and covered with more of the paste-like dispersion $D_3$ and the whole assembly placed in a boat which was inserted in a furnace containing an atmosphere of forming gas (10% hydrogen, 90% nitrogen). The boat and its contents were slow heated, i.e., 10 minutes at 100° C., 10 minutes at 300° C., ½ hour at 400° C. The semi-conductor was removed and allowed to cool. The bond formed between the wire and the semi-conductor broke under a straight pull of 60 grms.

Burnishing (if the size of the joint will permit it) and reheating are desirable to increase the strength of the joint.

If the maximum service temperature does not exceed, say 700° C. metals such as nickel and copper may be used as the metal powder, but our preference is wholly to the precious metals in that they offer a high melting point, resistance to acid attack and nobility.

The present invention is particularly applicable to semi-conductor devices which are designed for service at high temperatures although the semi-conductor devices produced in accordance with the present invention may also be used advantageously at lower temperatures. Thus, the semi-conductor materials with which joints may be made in accordance with this invention include silicon, germanium, silicon carbide, lead telluride, bismuth telluride, metal oxides, e.g., nickel oxides and ruthenium oxides, and compounds of the elements of Groups III and V of the periodic table which are known as III–V semi-conductors and include such compounds as gallium arsenide, indium arsenide, gallium phosphide, gallium antimonide, indium antimonide, boron nitride, aluminium nitride, etc.

Although the present invention has been described in conjunction with preferred embodiments, it is to be understood that modifications and variations may be resorted to without departing from the spirit and scope of the invention as those skilled in the art will readily understand. Such modifications and variations are considered to be within the purview and scope of the invention and appended claims.

We claim:

1. A process for securing a platinum-group metal conductor to a semiconductor comprising coating at least a portion of a surface of said semiconductor with the reaction product of chloroplatinic acid and di-iso-propyl ether concentrated in the presence of nitric acid, thereafter slowly heating the coated surface of the semiconductor to about 450° C. in a non-oxidizing atmosphere to decompose said reaction product and to provide a platinum layer firmly adherent to said semiconductor surface, cooling said layer to about room temperature, connecting the end of a platinum-group metal conductor having a flattened end to said platinum layer by coating said layer with a paste-like dispersion of platinum-group metal powder in a liquid, thermally decomposable compound selected from the group consisting of (a) alkaline condensed methanol methyl cyclohexane polymer in 2-ethoxy ethanol, (b) the reaction product of chloroplatinic acid and di-iso-propyl ether concentrated in the presence of nitric acid and (c) a solution of gold-tertiary-dodecyl-mercaptan in heptane containing 30% gold, embedding said flattened end in said coating to completely cover said flattened conductor end, and thereafter slowly heating the thus formed assembly to a temperature in the range from about 400° C. to about 450° C. in a non-oxidizing atmosphere to decompose said reaction product and to form an adherent metal mass which secures said conductor to said platinum layer.

2. A process as set forth in claim 2 wherein said metal conductor and said metal powder are of platinum and wherein the thermally decomposable compound is the reaction product of chloroplatinic acid and di-iso-propyl ether concentrated in the presence of nitric acid.

3. A process as set forth in claim 2 wherein said adherent metal mass is burnished and reheated to strengthen said mass.

4. A process for producing a semiconductor device that is serviceable at temperatures up to 1000° C. comprising providing a semiconductor of ruthenium dioxide, coating at least a portion of a surface of said semiconductor with the reaction product of chloroplatinic acid and di-iso-propyl ether concentrated in the presence of nitric acid, thereafter slowly heating the coated surface of the semiconductor to about 450° C. in a non-oxidizing atmosphere to decompose said reaction product and to provide a platinum layer firmly adherent to said semiconductor surface, cooling said layer to about room temperature, connecting the end of a platinum metal conductor having a flattened end to said platinum layer by coating said layer with a paste-like dispersion of platinum metal powder in the reaction product of chloroplatinic acid and di-iso-propyl ether concentrated in the presence of nitric acid, embedding said flattened end in said coating to completely cover said flattened conductor end, and thereafter slowly heating the thus formed assembly to about 450° C. in a non-oxidizing atmosphere to decompose said reaction product and to form an adherent metal mass which secures said conductor to said platinum metal layer.

References Cited by the Examiner

UNITED STATES PATENTS

| | | | |
|---|---|---|---|
| 2,418,460 | 4/47 | Buehler | 29—473.1 X |
| 2,509,909 | 5/50 | Davis | 29—472.9 X |
| 2,856,681 | 10/58 | Lacy | 29—155.55 X |
| 3,028,663 | 4/62 | Iwersen et al. | 29—155.55 X |

JOHN F. CAMPBELL, *Primary Examiner.*

GEORGE N. WESTBY *Examiner.*

UNITED STATES PATENT OFFICE

CERTIFICATE OF CORRECTION

Patent No. 3,186,084 June 1, 1965

Walter Betteridge et al.

It is hereby certified that error appears in the above numbered patent requiring correction and that the said Letters Patent should read as corrected below.

Column 6, lines 29 and 34, for the claim reference numeral "2", each occurrence, read -- 1 --.

Signed and sealed this 8th day of March 1966.

(SEAL)
Attest:

ERNEST W. SWIDER
Attesting Officer

EDWARD J. BRENNER
Commissioner of Patents